United States Patent
Yang et al.

(10) Patent No.: US 10,490,502 B2
(45) Date of Patent: Nov. 26, 2019

(54) POWER DISTRIBUTION NETWORK OF INTEGRATED CIRCUIT

(71) Applicant: Faraday Technology Corp., Hsinchu (TW)

(72) Inventors: Yi-Yeh Yang, Hsinchu (TW); Wang-Chin Chen, Hsinchu (TW); Po-Chen Lo, Hsinchu (TW); Shang-Ru Lin, Hsinchu (TW); Jen-Hsing Lin, Hsinchu (TW); Jin-Cheng Chen, Hsinchu (TW)

(73) Assignee: Faraday Technology Corp., Hsin-Chu (TW)

(*) Notice: Subject to any disclaimer, the term of this patent is extended or adjusted under 35 U.S.C. 154(b) by 75 days.

(21) Appl. No.: 15/860,669

(22) Filed: Jan. 3, 2018

(65) Prior Publication Data
US 2019/0122986 A1    Apr. 25, 2019

(30) Foreign Application Priority Data
Oct. 20, 2017  (TW) .............................. 106136253 A

(51) Int. Cl.
*H01L 23/50* (2006.01)
*G06F 17/50* (2006.01)
(Continued)

(52) U.S. Cl.
CPC .......... *H01L 23/5286* (2013.01); *H01L 23/50* (2013.01); *H01L 24/05* (2013.01);
(Continued)

(58) Field of Classification Search
CPC ..... H01L 23/5286; H01L 23/50; H01L 24/05; H01L 24/06
(Continued)

(56) References Cited

U.S. PATENT DOCUMENTS 6,653,726 B1 * 11/2003 Schultz ............... H01L 23/5286
257/691
6,657,870 B1 * 12/2003 Ali .................... H01L 23/49838
174/250
(Continued)

FOREIGN PATENT DOCUMENTS

TW    200814280    3/2008
TW    200847392    12/2008
(Continued)

*Primary Examiner* — Stacy Whitmore
(74) *Attorney, Agent, or Firm* — Winston Hsu

(57) ABSTRACT

A power distribution network adapted to provide power to a plurality of components in an integrated circuit is provided. The power distribution network includes a power distribution trunk path, a plurality of first power distribution branch paths, and a plurality of second power distribution branch paths. The power distribution trunk path is used for transmitting the power. A long axis direction of the power distribution trunk path is a first direction. The first power distribution branch paths and the second power distribution branch paths are electrically connected to the power distribution trunk path. A long axis direction of the first power distribution branch paths is a second direction different from the first direction. A long axis direction of the second power distribution branch paths is a third direction different from the first direction and the second direction.

14 Claims, 6 Drawing Sheets

(51) Int. Cl.
*H01L 23/528* (2006.01)
*H01L 23/00* (2006.01)
(52) U.S. Cl.
CPC .... *H01L 24/06* (2013.01); *H01L 2224/05013* (2013.01); *H01L 2224/06165* (2013.01); *H01L 2924/14* (2013.01)
(58) Field of Classification Search
USPC .......................................................... 716/120
See application file for complete search history.

(56) References Cited

U.S. PATENT DOCUMENTS

| | | | |
|---|---|---|---|
| 7,602,058 B2 * | 10/2009 | Katou | H01L 23/5286 257/691 |
| 8,336,018 B2 | 12/2012 | Turner et al. | |
| 2005/0023705 A1 * | 2/2005 | Campbell | H01L 23/5286 257/786 |
| 2006/0175637 A1 * | 8/2006 | Lee | H01L 27/0207 257/207 |
| 2008/0191348 A1 * | 8/2008 | Meyer-Berg | H01L 23/49838 257/738 |
| 2017/0294448 A1 | 10/2017 | Debacker et al. | |

FOREIGN PATENT DOCUMENTS

| | | |
|---|---|---|
| TW | 200908261 | 2/2009 |
| TW | 201103116 | 1/2011 |

* cited by examiner

POWER DISTRIBUTION NETWORK OF INTEGRATED CIRCUIT

CROSS-REFERENCE TO RELATED APPLICATION

This application claims the priority benefit of Taiwan application serial no. 106136253, filed on Oct. 20, 2017. The entirety of the above-mentioned patent application is hereby incorporated by reference herein and made a part of this specification.

BACKGROUND OF THE INVENTION

Field of the Invention

The invention relates to an integrated circuit, and particularly relates to a layout structure of a power distribution network of an integrated circuit.

Description of Related Art

A power distribution network of an integrated circuit may transmit electric power, and provide the same to a plurality of components in the integrated circuit. Due to a layout structure, the conventional power distribution network requires two metal layers to respectively transmit a power voltage and a ground voltage. For example, by viewing the integrated circuit from a top view, the conventional power distribution network has a plurality of wires extending along a horizontal direction (which are referred to as horizontal wires hereinafter) and a plurality of wires extending along a vertical direction (which are referred to as vertical wires hereinafter), where the horizontal wires parallel to each other are disposed in one metal layer, and the vertical wires parallel to each other are disposed in another metal layer. The horizontal wires and the vertical wires may transmit the power voltage and the ground voltage. Therefore, all of the components in the integrated circuit may receive power supply from the horizontal wires and the vertical wires. However, the conventional power distribution network requires two metal layers to achieve a uniform distribution in the horizontal direction and the vertical direction, and the two metal layers results in increase of cost. Moreover, the wires of the power distribution network generally have a resistance characteristic, and the resistance characteristic of the wires and the layout structure may influence voltage uniformity of the power distribution network.

SUMMARY OF THE INVENTION

The invention is directed to a power distribution network of an integrated circuit, which has improved voltage uniformity.

The invention provides a power distribution network of an integrated circuit, which is adapted to supply power to a plurality of components in the integrated circuit.

The power distribution network includes a first power distribution trunk path, a plurality of first power distribution branch paths, and a plurality of second power distribution branch paths. The first power distribution trunk path is disposed on the integrated circuit. The first power distribution trunk path is used for transmitting a first power. A long axis direction of the first power distribution trunk path is a first direction. The first power distribution branch paths are disposed on the integrated circuit, and are electrically connected to the first power distribution trunk path. A long axis direction of the first power distribution branch paths is a second direction different to the first direction. The second power distribution branch paths are disposed on the integrated circuit, and are electrically connected to the first power distribution trunk path. A long axis direction of the second power distribution branch paths is a third direction different to the first direction and the second direction.

According to the above description, the power distribution network of the invention includes the power distribution trunk path of the first direction, the first power distribution branch paths of the second direction and the second power distribution branch paths of the third direction. Regardless of which power distribution branch path the power is fed in from, the power distribution trunk path may transmit the power to the other power distribution branch paths, so as to improve voltage uniformity of the power distribution network.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
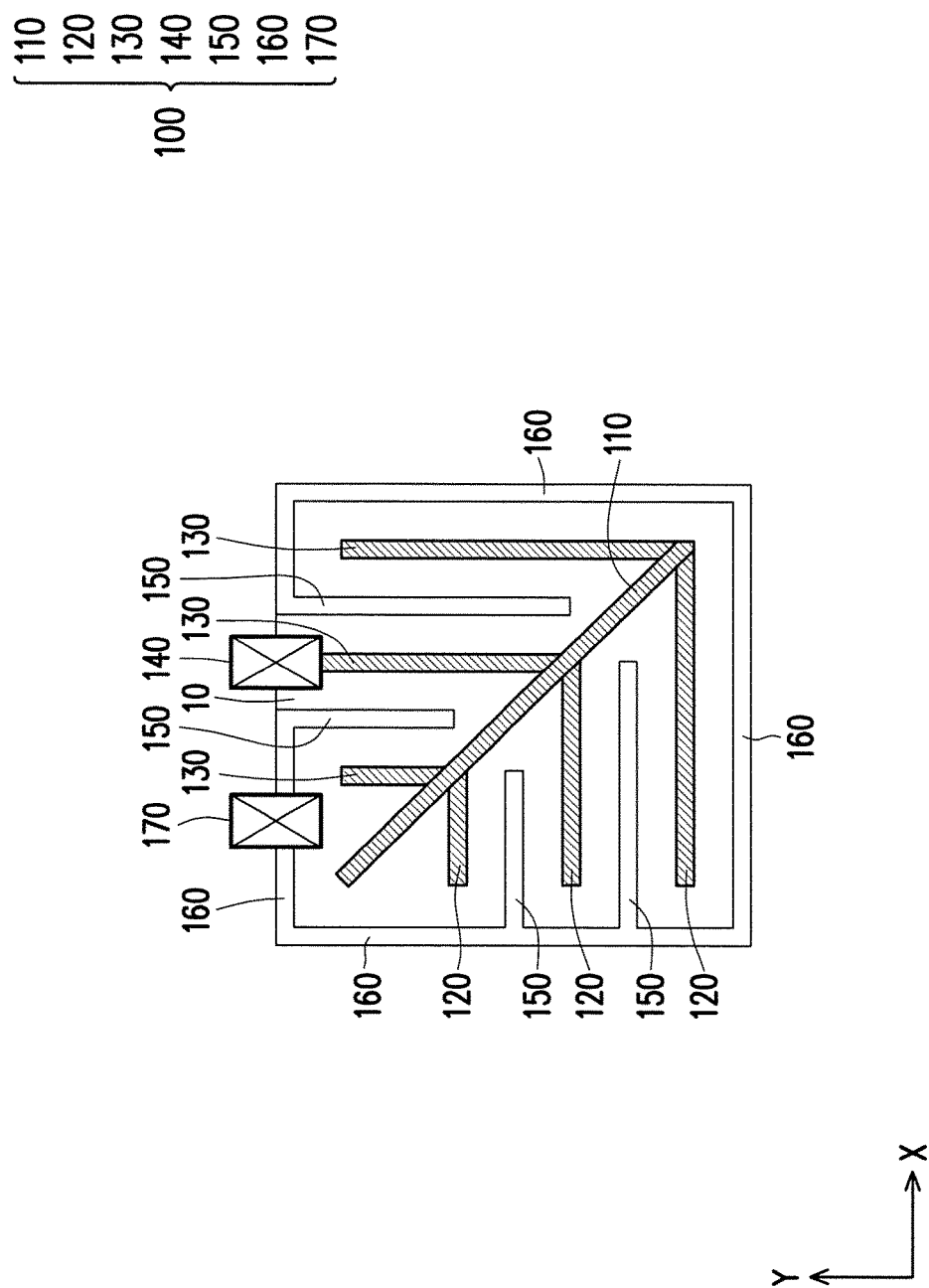
FIG. 1 is a top view of a layout structure of a power distribution network of an integrated circuit according to an embodiment of the invention.

A term "couple (connect)" used in the full text of the disclosure (including the claims) refers to any direct and indirect connections. For example, if a first device is described to be coupled (or connected) to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a top view of a layout structure of a power distribution network 100 of an integrated circuit 10 according to an embodiment of the invention. The integrated circuit 10 may be a chip. The power distribution network 100 is disposed on the integrated circuit 10. The power distribution network 100 is adapted to supply power to a plurality of components (not shown) in the integrated circuit 10. The power distribution network 100 includes a first power distribution trunk path 110, a plurality of first power distribution branch paths 120, and a plurality of second power distribution branch paths 130. A material of the first power distribution trunk path 110, the first power distribution branch paths 120 and the second power distribution branch paths 130 may be aluminum, copper or other conductive materials. A line width of the first power distribution trunk path 110, the first power distribution branch paths 120 and the second power distribution branch paths 130 may be determined according to a design requirement. For example, the line width of the first power distribution trunk path 110, the first power distribution branch paths 120 and/or the second power distribution branch paths 130 may be 5-20 μm.

The first power distribution trunk path 110 is disposed on the integrated circuit 10, and is used for transmitting a first power (for example, a system voltage VDD, a ground voltage GND or other power voltage). According to the design requirement, the first power distribution trunk path 110 may be a wire, or a plurality of wires is combined to from the first power distribution trunk path 110. In the embodiment of FIG. 1, the first power distribution trunk path 110 is a metal wire. A long axis direction of the first power distribution trunk path 110 is a first direction, where the first direction may be determined according to a design requirement. For example, in the embodiment of FIG. 1, the first power distribution trunk path 110 is disposed on a diagonal of the integrated circuit 10. In other embodiments, the first power distribution trunk path 110 may be disposed on other positions of the integrated circuit 10, where the direction of the first power distribution trunk path 110 is different to a direction of the first power distribution branch paths 120, and is also different to a direction of the second power distribution branch paths 130.

The first power distribution branch paths 120 are disposed on the integrated circuit 10. The first power distribution branch paths 120 are electrically connected to the first power distribution trunk path 110. A long axis direction of the first power distribution branch paths 120 is a second direction different to the first direction. In the embodiment of FIG. 1, the first power distribution branch paths 120 are metal wires. The number of the first power distribution branch paths 120 may be determined according to the design requirement and a size of the integrated circuit 10. Based on the top view of the integrated circuit 10 (as shown in FIG. 1), the first power distribution branch paths 120 are all disposed on the integrated circuit in a horizontal direction X, so that the first power distribution branch paths 120 are parallel to each other. Each one of the first power distribution branch paths 120 may transmit the first power to the first power distribution trunk path 110, and/or transmit the first power coming from the first power distribution trunk path 110 to a plurality of components (not shown) in the integrated circuit 10.

The second power distribution branch paths 130 are disposed on the integrated circuit 10. The second power distribution branch paths 130 are electrically connected to the first power distribution trunk path 110. A long axis direction of the second power distribution branch paths 130 is a third direction different to the first direction and the second direction. In the embodiment of FIG. 1, the second power distribution branch paths 130 are metal wires. The number of the second power distribution branch paths 130 may be determined according to the design requirement and the size of the integrated circuit 10. Based on the top view of the integrated circuit 10 (as shown in FIG. 1), the second power distribution branch paths 130 are all disposed on the integrated circuit in a vertical direction Y, so that the second power distribution branch paths 130 are parallel to each other. Each one of the second power distribution branch paths 130 may transmit the first power to the first power distribution trunk path 110, and/or transmit the first power coming from the first power distribution trunk path 110 to a plurality of components (not shown) in the integrated circuit 10. In the embodiment of FIG. 1, the first power distribution trunk path 110, the first power distribution branch paths 120 and the second power distribution branch paths 130 may be disposed in a same metal layer of the integrated circuit 10.

The power distribution network 100 of the integrated circuit 10 of FIG. 1 further includes a power pad 140. The power pad 140 is disposed on the integrated circuit 10. The power pad 140 is electrically connected to one end of one of the first power distribution branch paths 120 or electrically connected to one end of one of the second power distribution branch paths 130. According to a design requirement, in other embodiments, the power pad 140 may be electrically connected to one end of the first power distribution trunk path 110. In the embodiment of FIG. 1, the power pad 140 is electrically connected to one end of one of the second power distribution branch paths 130. The power pad 140 may transmit the first power provided by an external power supply circuit (not shown) to the first power distribution trunk path 110 through the power distribution branch path. The number of the power pad 140 may be determined according to the design requirement and the size of the integrated circuit 10. Based on the layout structure shown in FIG. 1, wherever a layout designer places the power pad 140 around the integrated circuit 10, the power pad 140 may be easily and electrically connected to the first power distribution trunk path 110, the first power distribution branch paths 120 and/or the second power distribution branch paths 130.

Based on the layout of the first power distribution trunk path 110, the first power distribution branch paths 120 and/or the second power distribution branch paths 130, the power distribution network 100 of the integrated circuit 10 of FIG. 1 may further include one or a plurality of first power distribution wires 150 and one or a plurality of second power distribution wires 160. The first power distribution wires 150 and the second power distribution wires 160 are disposed on the integrated circuit 10. The first power distribution wires 150 are disposed between the first power distribution branch paths 120 and/or disposed between the second power distribution branch paths 130. The first power distribution wires 150 are used for transmitting a second power (for example, the system voltage VDD, the ground voltage GND or the other power voltage) different to the first power. The second power distribution wires 160 are disposed on the periphery of the integrated circuit 10, as shown in FIG. 1. The second power distribution wires 160 are electrically connected to the first power distribution wires 150. The first power distribution wires 150 and the second power distribution wires 160 do not electrically contact the first power distribution trunk path 110, the first power distribution branch paths 120 and the second power distribution branch paths 130. In the embodiment of FIG. 1, the first power distribution trunk path 110, the first power distribution branch paths 120, the second power distribution branch paths 130, the first power distribution wires 150 and the second power distribution wires 160 are disposed inn a same metal layer of the integrated circuit 10.

A power pad 170 is disposed on the integrated circuit 10. The power pad 170 is electrically connected to the second power distribution wires 160. The power pad 170 may transmit the second power provided by an external power supply circuit (not shown) to the first power distribution wires 150 through the second power distribution wires 160. According to a design requirement, in some embodiments, the power pad 140 is used for transmitting the system voltage VDD (the first power), and the power pad 170 is used for transmitting the ground voltage GND (the second power). In some other embodiments, the power pad 140 is used for transmitting the ground voltage GND (the first power), and the power pad 170 is used for transmitting the system voltage VDD (the second power).

Figure 2:
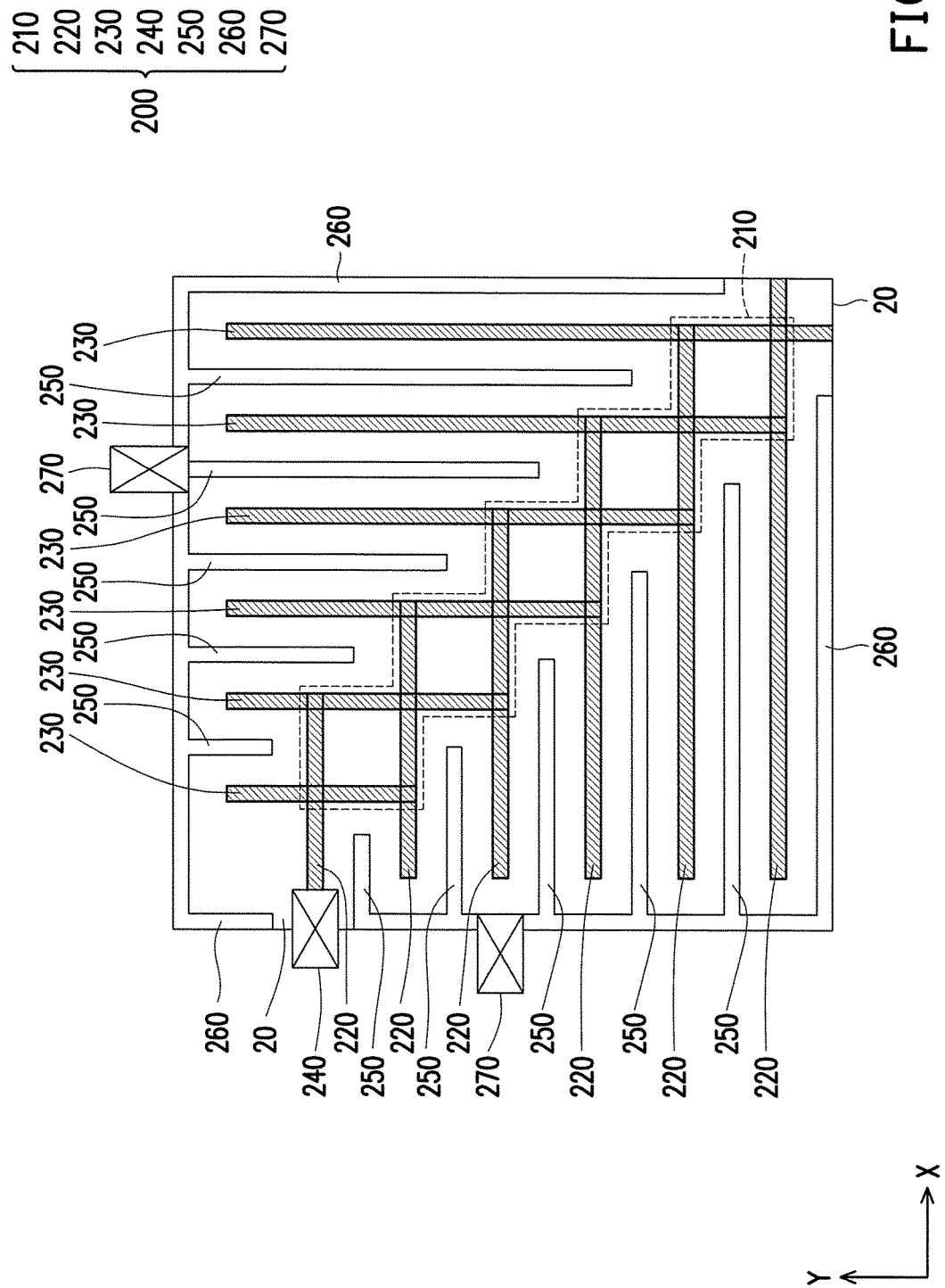
FIG. 2 is a top view of a layout structure of a power distribution network of an integrated circuit according to another embodiment of the invention.

FIG. 2 is a top view of a layout structure of a power distribution network 200 of an integrated circuit 20 according to another embodiment of the invention. The integrated circuit 20 may be a chip. The power distribution network 200 is disposed on the integrated circuit 20. The power distribution network 200 is adapted to supply power to a plurality of components (not shown) in the integrated circuit 20. The power distribution network 200 includes one first power distribution trunk path 210, a plurality of first power distribution branch paths 220, a plurality of second power distribution branch paths 230, one power pad 240, a plurality of first power distribution wires 250, a plurality of second power distribution wires 260 and a plurality of power pads 270.

Based on the top view of the integrated circuit 20 (as shown in FIG. 2), the first power distribution branch paths 220 are all disposed on the integrated circuit 20 in the horizontal direction X, and the second power distribution branch paths 230 are all disposed on the integrated circuit 20 in the vertical direction Y. The first power distribution trunk path 210, the first power distribution branch paths 220, the second power distribution branch paths 230, the power pad 240, the first power distribution wires 250, the second power distribution wires 260 and the power pads 270 of FIG. 2 may be deduced with reference of related descriptions of the first power distribution trunk path 110, the first power distribution branch paths 120, the second power distribution branch paths 130, the power pad 140, the first power distribution wires 150, the second power distribution wires 160 and the power pad 170 of FIG. 1, and details thereof are not repeated.

In the embodiment of FIG. 2, the first power distribution trunk path 210 may have a grid structure. A part of any one of the first power distribution branch paths 220 is electrically connected to a part of any one of the second power distribution branch paths 230 to form a grid structure, as shown in FIG. 2. The grid structure may serve as the first power distribution trunk path 210. In the embodiment of FIG. 2, a long axis direction (the first direction) of the first power distribution trunk path 210 is different to a long axis direction (the second direction) of the first power distribution branch paths 220, and is also different to a long axis direction (the third direction) of the second power distribution branch paths 230. For example, in the embodiment of FIG. 2, the first power distribution trunk path 210 is disposed on a diagonal of the integrated circuit 20. In other embodiments, the first power distribution trunk path 210 may also be disposed at other positions of the integrated circuit 20.

Figure 3:
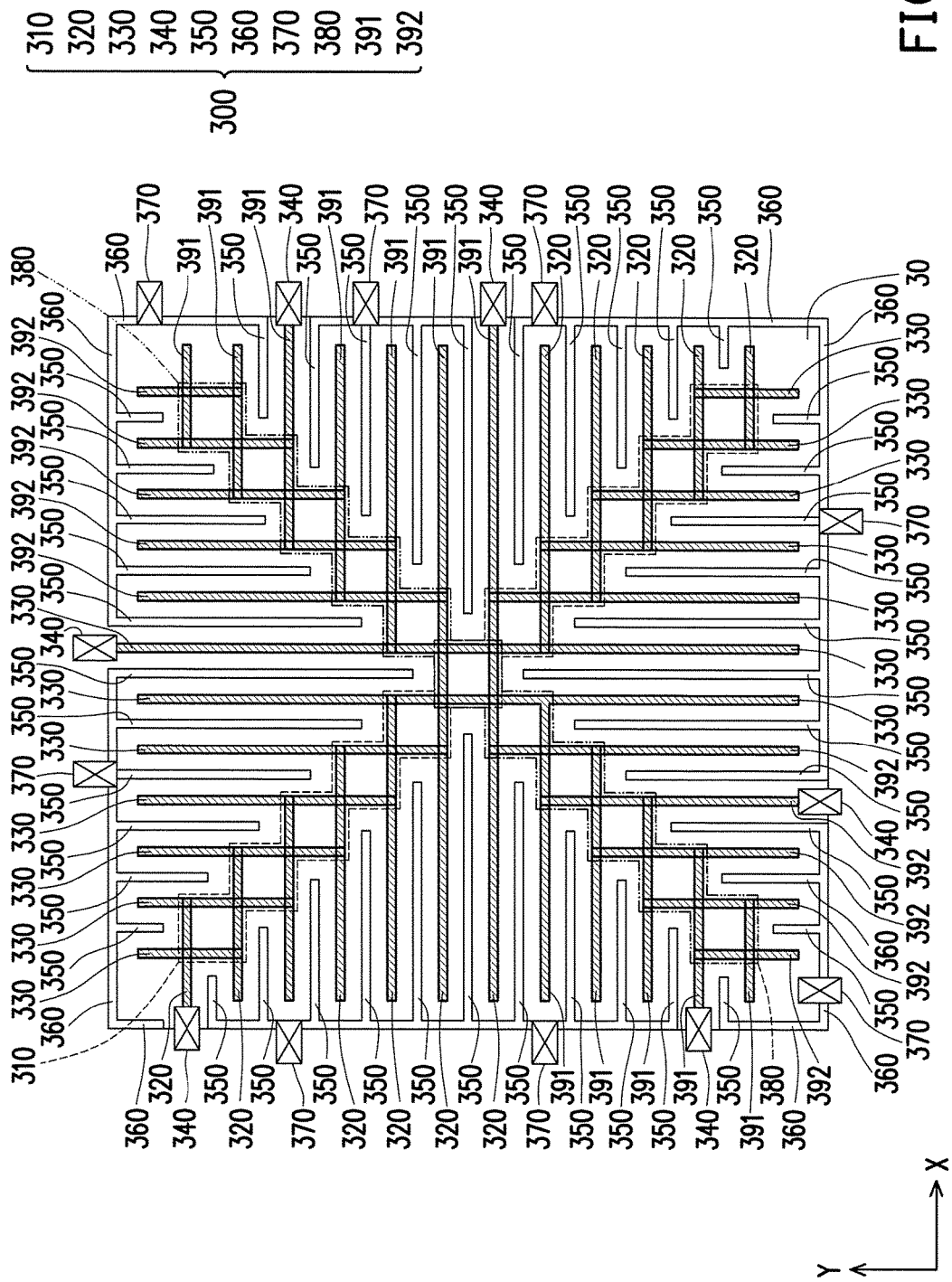
FIG. 3 is a top view of a layout structure of a power distribution network of an integrated circuit according to still another embodiment of the invention.

FIG. 3 is a top view of a layout structure of a power distribution network 300 of an integrated circuit 30 according to still another embodiment of the invention. The integrated circuit 30 may be a chip. The power distribution network 300 is disposed on the integrated circuit 30. The power distribution network 300 is adapted to supply power to a plurality of components (not shown) in the integrated circuit 30. The power distribution network 300 includes one first power distribution trunk path 310, a plurality of first power distribution branch paths 320, a plurality of second power distribution branch paths 330, a plurality of power pads 340, a plurality of first power distribution wires 350, a plurality of second power distribution wires 360 and a plurality of power pads 370. Based on the top view of the integrated circuit 30 (as shown in FIG. 3), the first power distribution branch paths 320 are all disposed on the integrated circuit 30 in the horizontal direction X, and the second power distribution branch paths 330 are all disposed on the integrated circuit 30 in the vertical direction Y. The first power distribution trunk path 310, the first power distribution branch paths 320, the second power distribution branch paths 330, the power pads 340, the first power distribution wires 350, the second power distribution wires 360 and the power pads 370 of FIG. 3 may be deduced with reference of related descriptions of the first power distribution trunk path 210, the first power distribution branch paths 220, the second power distribution branch paths 230, the power pad 240, the first power distribution wires 250, the second power distribution wires 260 and the power pads 270 of FIG. 2, and details thereof are not repeated.

In the embodiment of FIG. 3, the power distribution network 300 of the integrated circuit 30 further includes a second power distribution trunk path 380, a plurality of third power distribution branch paths 391 and a plurality of fourth power distribution branch paths 392. The second power distribution trunk path 380, the third power distribution branch paths 391 and the fourth power distribution branch paths 392 are disposed on the integrated circuit 30. The first power distribution trunk path 310 and the second power distribution trunk path 380 are electrically connected to each other. In the embodiment shown in FIG. 3, the second power distribution trunk path 380 may have a grid structure. A long axis direction (a fourth direction) of the second power distribution trunk path 380 is different to the long axis direction (the first direction) of the first power distribution trunk path 310, the long axis direction (the second direction) of the first power distribution branch paths 320 and the long axis direction (the third direction) of the second power distribution branch paths 330. For example, in the embodiment of FIG. 3, the first power distribution trunk path 310 is disposed on a diagonal of the integrated circuit 30, and the second power distribution trunk path 380 is disposed on another diagonal of the integrated circuit 30. In other embodiments, the first power distribution trunk path 310 and/or the second power distribution trunk path 380 may also be disposed at other positions of the integrated circuit 30.

The third power distribution branch paths 391 and the fourth power distribution branch paths 392 are electrically connected to the second power distribution trunk path 380. A long axis direction of the third power distribution branch paths 391 is the second direction, and a long axis direction of the fourth power distribution branch paths 392 is the third direction. Based on the top view of the integrated circuit 30 (as shown in FIG. 3), the third power distribution branch paths 391 are all disposed on the integrated circuit 30 in the horizontal direction X, and the fourth power distribution branch paths 392 are all disposed on the integrated circuit 30 in the vertical direction Y. A part of any one of the third power distribution branch paths 391 is electrically connected to a part of any one of the fourth power distribution branch paths 392 to form a grid structure, as shown in FIG. 3. The grid structure may serve as the second power distribution trunk path 380. In the embodiment of FIG. 3, the first power distribution trunk path 310, the first power distribution branch paths 320, the second power distribution branch paths 330, the second power distribution trunk path 380, the third power distribution branch paths 391 and the fourth power distribution branch paths 392 are disposed in a same metal layer of the integrated circuit 30. A material of the third power distribution branch paths 391 and the fourth power distribution branch paths 392 may be aluminum, copper or other conductive materials. A line width of the third power distribution branch paths 391 and the fourth power distribution branch paths 392 may be determined according to a design requirement. For example, the line width of the third power distribution branch paths 391 and/or the fourth power distribution branch paths 392 may be 5-20 μm.

Figure 4:
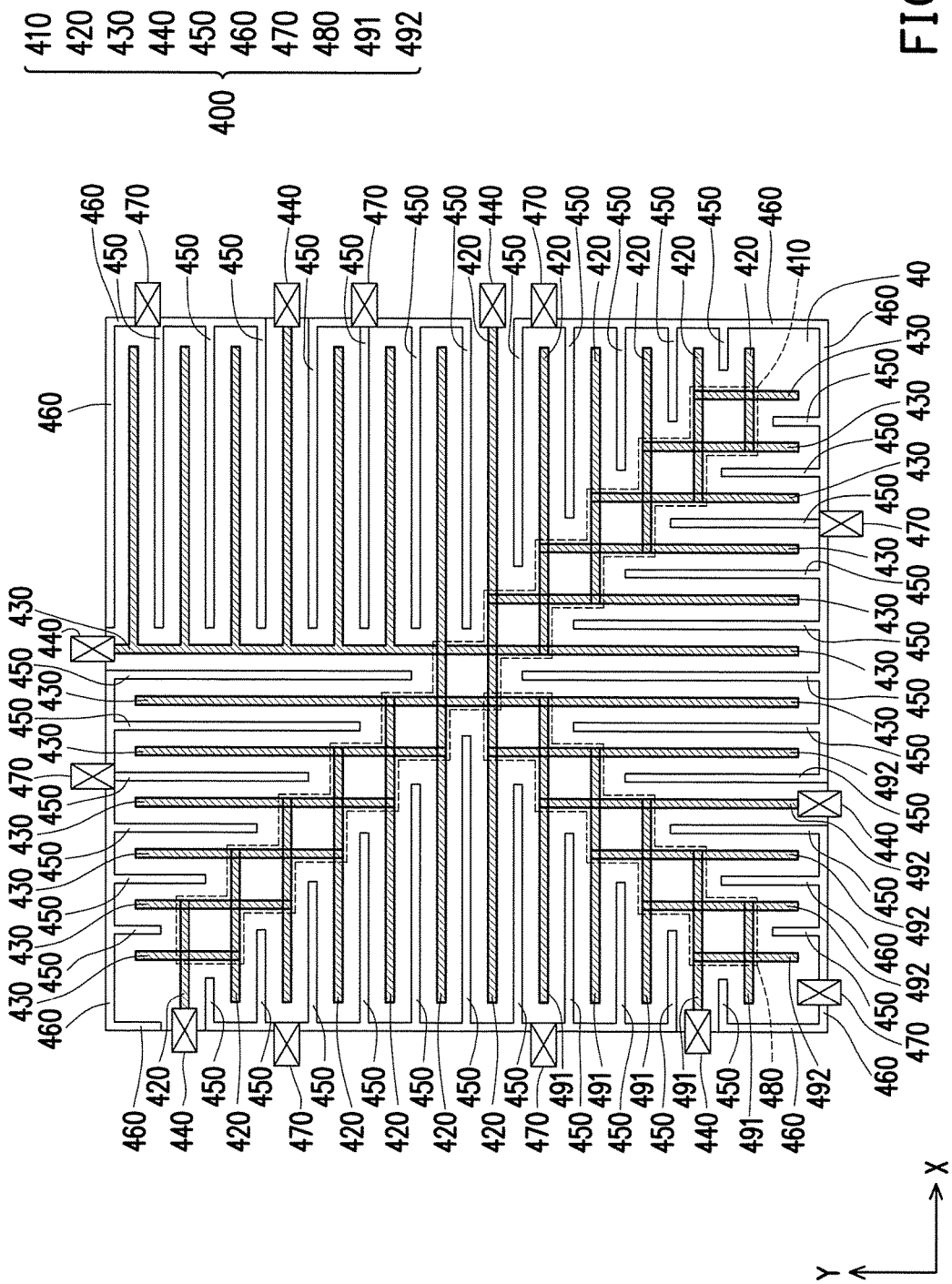
FIG. 4 is a top view of a layout structure of a power distribution network of an integrated circuit according to still another embodiment of the invention.

FIG. 4 is a top view of a layout structure of a power distribution network 400 of an integrated circuit 40 according to still another embodiment of the invention. The integrated circuit 40 may be a chip. The power distribution network 400 is disposed on the integrated circuit 40. The power distribution network 400 is adapted to supply power to a plurality of components (not shown) in the integrated circuit 40. The power distribution network 400 includes one first power distribution trunk path 410, a plurality of first power distribution branch paths 420, a plurality of second power distribution branch paths 430, a plurality of power pads 440, a plurality of first power distribution wires 450, a plurality of second power distribution wires 460, a plurality of power pads 470, a second power distribution trunk path 480, a plurality of third power distribution branch paths 491 and a plurality of fourth power distribution branch paths 492. Based on the top view of the integrated circuit 40 (as shown in FIG. 4), the first power distribution branch paths 420 and the third power distribution branch paths 491 are all disposed on the integrated circuit 40 in the horizontal direction X, and the second power distribution branch paths 430 and the fourth power distribution branch paths 492 are all disposed on the integrated circuit 40 in the vertical direction Y. The first power distribution trunk path 410, the first power distribution branch paths 420, the second power distribution branch paths 430, the power pads 440, the first power distribution wires 450, the second power distribution wires 460, the power pads 470, the second power distribution trunk path 480, the third power distribution branch paths 491 and the fourth power distribution branch paths 492 of FIG. 4 may be deduced with reference of related descriptions of the first power distribution trunk path 310, the first power distribution branch paths 320, the second power distribution branch paths 330, the power pad 340, the first power distribution wires 350, the second power distribution wires 360, the power pads 370, the second power distribution trunk path 380, the third power distribution branch paths 391 and the fourth power distribution branch paths 392 of FIG. 3, and details thereof are not repeated.

Figure 5:
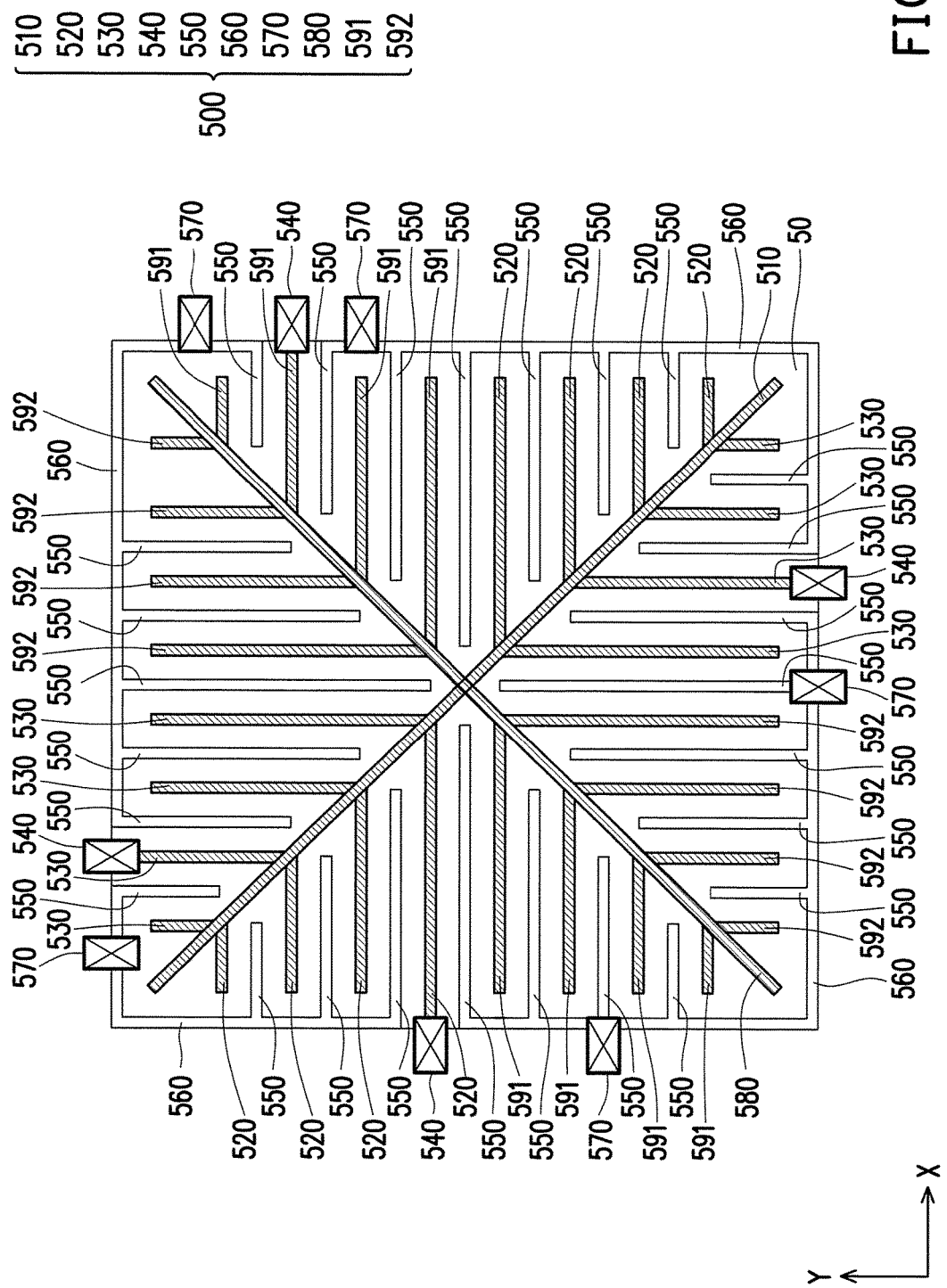
FIG. 5 is a top view of a layout structure of a power distribution network of an integrated circuit according to still another embodiment of the invention.

FIG. 5 is a top view of a layout structure of a power distribution network 500 of an integrated circuit 50 according to still another embodiment of the invention. The integrated circuit 50 may be a chip. The power distribution network 500 is disposed on the integrated circuit 50. The power distribution network 500 is adapted to supply power to a plurality of components (not shown) in the integrated circuit 50. The power distribution network 500 includes one first power distribution trunk path 510, a plurality of first power distribution branch paths 520, a plurality of second power distribution branch paths 530, a plurality of power pads 540, a plurality of first power distribution wires 550, a plurality of second power distribution wires 560, a plurality of power pads 570, a second power distribution trunk path 580, a plurality of third power distribution branch paths 591 and a plurality of fourth power distribution branch paths 592. Based on the top view of the integrated circuit 50 (as shown in FIG. 5), the first power distribution branch paths 520 and the third power distribution branch paths 591 are all disposed on the integrated circuit 50 in the horizontal direction X, and the second power distribution branch paths 530 and the fourth power distribution branch paths 592 are all disposed on the integrated circuit 50 in the vertical direction Y. The first power distribution trunk path 510, the first power distribution branch paths 520, the second power distribution branch paths 530, the power pads 540, the first power distribution wires 550, the second power distribution wires 560 and the power pads 570 of FIG. 5 may be deduced with reference of related descriptions of the first power distribution trunk path 110, the first power distribution branch paths 120, the second power distribution branch paths 130, the power pad 140, the first power distribution wires 150, the second power distribution wires 160, the power pad 170 of FIG. 1, and details thereof are not repeated.

In the embodiment of FIG. 5, the power distribution network 500 of the integrated circuit 50 further includes a second power distribution trunk path 580, a plurality of third power distribution branch paths 591 and a plurality of fourth power distribution branch paths 592. The second power distribution trunk path 580, the third power distribution branch paths 591 and the fourth power distribution branch paths 592 are disposed on the integrated circuit 50. The first power distribution trunk path 510 and the second power distribution trunk path 580 are electrically connected to each other. In the embodiment shown in FIG. 5, the second power distribution trunk path 580 may be a wire. A long axis direction (a fourth direction) of the second power distribution trunk path 580 is different to the long axis direction (the first direction) of the first power distribution trunk path 510, the long axis direction (the second direction) of the first power distribution branch paths 520 and the long axis direction (the third direction) of the second power distribution branch paths 530. For example, in the embodiment of FIG. 5, the first power distribution trunk path 510 is disposed on a diagonal of the integrated circuit 50, and the second power distribution trunk path 580 is disposed on another diagonal of the integrated circuit 50. In other embodiments, the first power distribution trunk path 510 and/or the second power distribution trunk path 580 may also be disposed at other positions of the integrated circuit 50.

The third power distribution branch paths 591 and the fourth power distribution branch paths 592 are electrically connected to the second power distribution trunk path 580. A long axis direction of the third power distribution branch paths 591 is the second direction, and a long axis direction of the fourth power distribution branch paths 592 is the third direction. Based on the top view of the integrated circuit 50 (as shown in FIG. 5), the third power distribution branch paths 591 are all disposed on the integrated circuit 50 in the horizontal direction X, and the fourth power distribution branch paths 592 are all disposed on the integrated circuit 50 in the vertical direction Y. In the embodiment of FIG. 5, the first power distribution trunk path 510, the first power distribution branch paths 520, the second power distribution branch paths 530, the second power distribution trunk path 580, the third power distribution branch paths 591 and the fourth power distribution branch paths 592 are disposed in a same metal layer of the integrated circuit 50. A material of the second power distribution trunk path 580, the third power distribution branch paths 591 and the fourth power distribution branch paths 592 may be aluminum, copper or other conductive materials. A line width of the second power distribution trunk path 580, the third power distribution branch paths 591 and the fourth power distribution branch paths 592 may be determined according to a design requirement. For example, the line width of second power distribution trunk path 580, the third power distribution branch paths 591 and/or the fourth power distribution branch paths 592 may be 5-20 μm.

Figure 6:
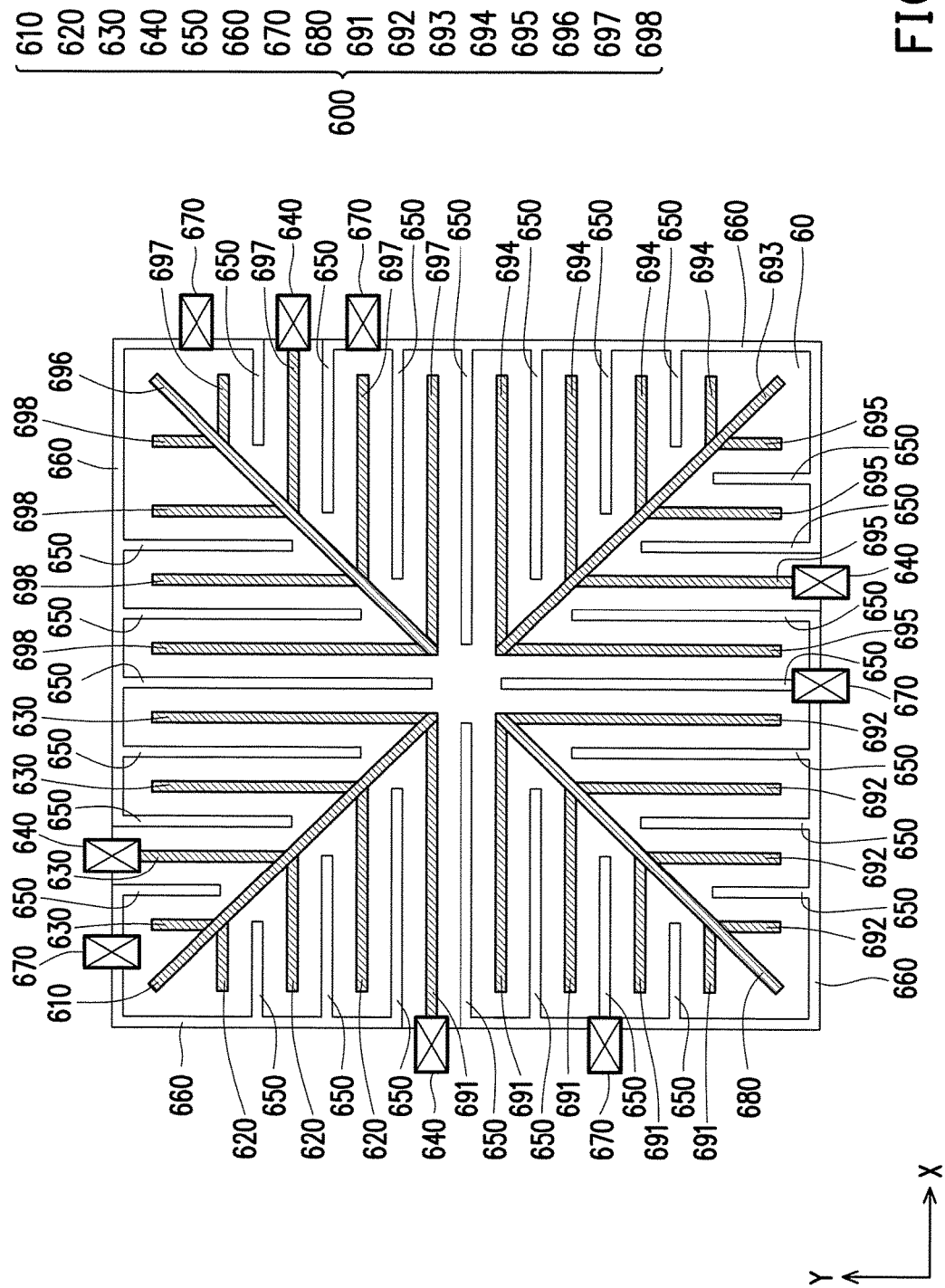
FIG. 6 is a top view of a layout structure of a power distribution network of an integrated circuit according to still another embodiment of the invention.

FIG. 6 is a top view of a layout structure of a power distribution network 600 of an integrated circuit 60 according to still another embodiment of the invention. The integrated circuit 60 may be a chip. The power distribution network 600 is disposed on the integrated circuit 60. The power distribution network 600 is adapted to supply power to a plurality of components (not shown) in the integrated circuit 60. The power distribution network 600 includes one first power distribution trunk path 610, a plurality of first power distribution branch paths 620, a plurality of second power distribution branch paths 630, a plurality of power pads 640, a plurality of first power distribution wires 650, a plurality of second power distribution wires 660, a plurality of power pads 670, a second power distribution trunk path 680, a plurality of third power distribution branch paths 691 and a plurality of fourth power distribution branch paths 692. Based on the top view of the integrated circuit 60 (as shown in FIG. 6), the first power distribution branch paths 620 and the third power distribution branch paths 691 are all disposed on the integrated circuit 60 in the horizontal direction X, and the second power distribution branch paths 630 and the fourth power distribution branch paths 692 are all disposed on the integrated circuit 60 in the vertical direction Y.

The first power distribution trunk path 610, the first power distribution branch paths 620, the second power distribution branch paths 630, the power pads 640, the first power distribution wires 650, the second power distribution wires 660, the power pads 670, the second power distribution trunk path 680, the third power distribution branch paths 691 and the fourth power distribution branch paths 692 of FIG. 6 may be deduced with reference of related descriptions of the first power distribution trunk path 510, the first power distribution branch paths 520, the second power distribution branch paths 530, the power pads 540, the first power distribution wires 550, the second power distribution wires 560, the power pads 570, the second power distribution trunk path 580, the third power distribution branch paths 591 and the fourth power distribution branch paths 592 of FIG. 5, and details thereof are not repeated. In the embodiment of FIG. 6, the first power distribution trunk path 610 is not electrically connected to the second power distribution trunk path 680.

In the embodiment of FIG. 6, the power distribution network 600 of the integrated circuit 60 further includes a third power distribution trunk path 693, a plurality of fifth power distribution branch paths 694, a plurality of sixth power distribution branch paths 695, a fourth power distribution trunk path 696, a plurality of seventh power distribution branch paths 697, a plurality of eighth power distribution branch paths 698. The third power distribution trunk path 693, the fifth power distribution branch paths 694, the sixth power distribution branch paths 695, the fourth power distribution trunk path 696, the seventh power distribution branch paths 697 and the eighth power distribution branch paths 698 are disposed on the integrated circuit 60. The first power distribution trunk path 610, the second power distribution trunk path 680, the third power distribution trunk path 693 and the fourth power distribution trunk path 696 are not electrically connected to each other. In the embodiment of FIG. 6, the third power distribution trunk path 693 and the fourth power distribution trunk path 696 may be wires. A long axis direction of the third power distribution trunk path 693 is the same to the long axis direction (the first direction) of the first power distribution trunk path 610, and a long axis direction of the fourth power distribution trunk path 696 is the same to the long axis direction (the fourth direction) of the second power distribution trunk path 680. For example, in the embodiment of FIG. 6, the first power distribution trunk path 610 and the third power distribution trunk path 693 are disposed on a diagonal of the integrated circuit 60, and the second power distribution trunk path 680 and the fourth power distribution trunk path 696 are disposed on another diagonal of the integrated circuit 60. In other embodiments, the first power distribution trunk path 610, the second power distribution trunk path 680, the third power distribution trunk path 693 and/or the fourth power distribution trunk path 696 may also be disposed at other positions of the integrated circuit 60.

The fifth power distribution branch paths 694 and the sixth power distribution branch paths 695 are electrically connected to the third power distribution trunk path 693. The seventh power distribution branch paths 697 and the eighth power distribution branch paths 698 are electrically connected to the fourth power distribution trunk path 696. A long axis direction of the fifth power distribution branch paths 694 and the seventh power distribution branch paths 697 is the second direction, and a long axis direction of the sixth power distribution branch paths 695 and the eighth power distribution branch paths 698 is the third direction. Based on the top view of the integrated circuit 60 (as shown in FIG. 6), the fifth power distribution branch paths 694 and the seventh power distribution branch paths 697 are all disposed on the integrated circuit 60 in the horizontal direction X, and the sixth power distribution branch paths 695 and the eighth power distribution branch paths 698 are all disposed on the integrated circuit 60 in the vertical direction Y. In the embodiment of FIG. 6, the first power distribution trunk path 610, the first power distribution branch paths 620, the second power distribution branch paths 630, the second power distribution trunk path 680, the third power distribution branch paths 691, the fourth power distribution branch paths 692, the third power distribution trunk path 693, the fifth power distribution branch paths 694, the sixth power distribution branch paths 695, the fourth power distribution trunk path 696, the seventh power distribution branch paths 697 and the eighth power distribution branch paths 698 are disposed in a same metal layer of the integrated circuit 60.

In summary, the power distribution network of the invention includes the power distribution trunk path of the first direction, the first power distribution branch paths of the second direction and the second power distribution branch paths of the third direction. Regardless of which power distribution branch path the power is fed in from, the first power distribution trunk path may transmit the power to the other power distribution branch paths, so as to improve voltage uniformity of the power distribution network.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A power distribution network of an integrated circuit, adapted to supply power to a plurality of components in the integrated circuit, the power distribution network comprising:
   a first power distribution trunk path, disposed on the integrated circuit, and configured to transmit a first power, wherein a long axis direction of the first power distribution trunk path is a first direction;
   a plurality of first power distribution branch paths, disposed on the integrated circuit, and electrically connected to the first power distribution trunk path, wherein a long axis direction of the first power distribution branch paths is a second direction different to the first direction; and
   a plurality of second power distribution branch paths, disposed on the integrated circuit, and electrically connected to the first power distribution trunk path, wherein a long axis direction of the second power distribution branch paths is a third direction different to the first direction and the second direction,
   wherein the first power distribution trunk path, first power distribution branch paths and the second power distribution branch paths are not electrically connected to a first power distribution wire disposed between two of the first power distribution branch paths or between two of the second power distribution branch paths.

2. The power distribution network of the integrated circuit as claimed in claim 1, wherein the first power distribution trunk path, the first power distribution branch paths and the second power distribution branch paths are disposed in a same metal layer of the integrated circuit.

3. The power distribution network of the integrated circuit as claimed in claim 1, further comprising:
   a power pad, disposed on the integrated circuit, wherein the power pad is electrically connected to one end of the first power distribution trunk path, or electrically connected to one end of one of the first power distribution branch paths, or electrically connected to one end of one of the second power distribution branch paths.

4. The power distribution network of the integrated circuit as claimed in claim 1, wherein the first power distribution wire is disposed on the integrated circuit, and configured to transmit a second power different to the first power.

5. The power distribution network of the integrated circuit as claimed in claim 4, further comprising:
   a second power distribution wire, disposed on the integrated circuit, and disposed at a periphery of the integrated circuit, wherein the second power distribution wire is electrically connected to the first power distribution wire; and
   a power pad, disposed on the integrated circuit, wherein the power pad is electrically connected to the second power distribution wire.

6. The power distribution network of the integrated circuit as claimed in claim 5, wherein the first power distribution trunk path, the first power distribution branch paths, the second power distribution branch paths, the first power distribution wire and the second power distribution wire are disposed in a same metal layer of the integrated circuit.

7. The power distribution network of the integrated circuit as claimed in claim 1, wherein the first power distribution trunk path is disposed on a diagonal of the integrated circuit.

8. The power distribution network of the integrated circuit as claimed in claim 1, wherein a part of any one of the first power distribution branch paths is electrically connected to a part of any one of the second power distribution branch paths to form a grid structure, and the grid structure serves as the first power distribution trunk path.

9. The power distribution network of the integrated circuit as claimed in claim 1, further comprising:
   a second power distribution trunk path, disposed on the integrated circuit, wherein a long axis direction of the second power distribution trunk path is a fourth direction different to the first direction, the second direction and the third direction;
   a plurality of third power distribution branch paths, disposed on the integrated circuit, and electrically connected to the second power distribution trunk path, wherein a long axis direction of the third power distribution branch paths is the second direction; and
   a plurality of fourth power distribution branch paths, disposed on the integrated circuit, and electrically connected to the second power distribution trunk path, wherein a long axis direction of the fourth power distribution branch paths is the third direction.

10. The power distribution network of the integrated circuit as claimed in claim 9, wherein the first power distribution trunk path, the first power distribution branch paths, the second power distribution branch paths, the second power distribution trunk path, the third power distribution branch paths and the fourth power distribution branch paths are disposed in a same metal layer of the integrated circuit.

11. The power distribution network of the integrated circuit as claimed in claim 9, wherein the first power distribution trunk path is electrically connected to the second power distribution trunk path.

12. The power distribution network of the integrated circuit as claimed in claim 9, wherein a part of any one of the third power distribution branch paths is electrically connected to a part of any one of the fourth power distribution branch paths to form a grid structure, and the grid structure serves as the second power distribution trunk path.

13. The power distribution network of the integrated circuit as claimed in claim 9, further comprising:
   a third power distribution trunk path, disposed on the integrated circuit, wherein a long axis direction of the third power distribution trunk path is the first direction;
   a plurality of fifth power distribution branch paths, disposed on the integrated circuit, and electrically connected to the third power distribution trunk path, wherein a long axis direction of the fifth power distribution branch paths is the second direction;
   a plurality of sixth power distribution branch paths, disposed on the integrated circuit, and electrically connected to the third power distribution trunk path, wherein a long axis direction of the sixth power distribution branch paths is the third direction;
   a fourth power distribution trunk path, disposed on the integrated circuit, wherein a long axis direction of the fourth power distribution trunk path is the fourth direction;
   a plurality of seventh power distribution branch paths, disposed on the integrated circuit, and electrically connected to the fourth power distribution trunk path, wherein a long axis direction of the seventh power distribution branch paths is the second direction; and
   a plurality of eighth power distribution branch paths, disposed on the integrated circuit, and electrically connected to the fourth power distribution trunk path, wherein a long axis direction of the eighth power distribution branch paths is the third direction.

14. The power distribution network of the integrated circuit as claimed in claim 13, wherein the first power distribution trunk path, the second power distribution trunk path, the third power distribution trunk path and the fourth power distribution trunk path are not electrically connected to each other.

* * * * *